United States Patent
Brunner et al.

(10) Patent No.: US 8,413,321 B2
(45) Date of Patent: Apr. 9, 2013

(54) MODULE SUBSTRATE AND PRODUCTION METHOD

(75) Inventors: Sebastian Brunner, Graz (AT); Franz Kaul, Penzberg (DE); Annette Fischer, Lannach (AT)

(73) Assignee: Epcos AG, Munich (DE)

( * ) Notice: Subject to any disclaimer, the term of this patent is extended or adjusted under 35 U.S.C. 154(b) by 181 days.

(21) Appl. No.: 12/718,823

(22) Filed: Mar. 5, 2010

(65) Prior Publication Data

US 2010/0224394 A1 Sep. 9, 2010

(30) Foreign Application Priority Data

Mar. 6, 2009 (DE) .......................... 10 2009 012 139

(51) Int. Cl.
*H05K 3/36* (2006.01)
*H05K 7/10* (2006.01)
*H05K 7/12* (2006.01)

(52) U.S. Cl. ......................................... 29/830; 361/767

(58) Field of Classification Search .......... 361/767–771; 257/701, 703, 705, 737–738; 29/830, 840
See application file for complete search history.

(56) References Cited

U.S. PATENT DOCUMENTS

| | | | |
|---|---|---|---|
| 4,645,552 A | 2/1987 | Vitriol et al. | |
| 5,891,756 A | 4/1999 | Erickson | |
| 5,989,993 A | 11/1999 | Zakel et al. | |
| 6,180,265 B1 | 1/2001 | Erickson | |
| 6,583,019 B2 | 6/2003 | Vandermeulen et al. | |
| 7,351,916 B2* | 4/2008 | Hsu | 174/260 |
| 7,361,990 B2* | 4/2008 | Lu et al. | 257/738 |
| 7,615,874 B2 | 11/2009 | Suesada et al. | |
| 2003/0096493 A1 | 5/2003 | Vandermeulen et al. | |
| 2004/0000709 A1 | 1/2004 | Delacruz | |
| 2004/0245655 A1* | 12/2004 | Ida et al. | 257/784 |
| 2005/0142835 A1* | 6/2005 | Ball et al. | 438/612 |
| 2005/0241953 A1* | 11/2005 | Rine | 205/163 |
| 2007/0026196 A1* | 2/2007 | Ogawa et al. | 428/157 |
| 2007/0200221 A1 | 8/2007 | Suesada et al. | |
| 2009/0260856 A1 | 10/2009 | Suesada et al. | |

FOREIGN PATENT DOCUMENTS

EP 1 873 826 A2 1/2008

* cited by examiner

*Primary Examiner* — Jeremy Norris
(74) *Attorney, Agent, or Firm* — Slater & Matsil, L.L.P.

(57) ABSTRACT

A module substrate includes a multilayer substrate that includes a plurality of layers, a bottommost of the layers being a ceramic layer. Solderable contacts, which include fired pads composed of a conductive paste, are applied to the bottommost ceramic layer. A covering layer overlies the pads. The covering layer covers all outer edges of the pads. A window is cut out of the covering layer. A metallic coating is applied to each pad exclusively within the window.

20 Claims, 3 Drawing Sheets

MODULE SUBSTRATE AND PRODUCTION METHOD

This application claims priority to German Patent Application 10 2009 012 139.0, which was filed Mar. 6, 2009 and is incorporated herein by reference.

TECHNICAL FIELD

Embodiments of the present invention relate to a module substrate and a production method.

BACKGROUND

Module substrates are mechanically sufficiently stable carrier systems that preferably have an integrated electrical wiring and are provided for receiving one or preferably a plurality of interconnected chip components. Furthermore, it is also possible to realize passive components and circuits produced therefrom in the multilayer construction and thus to integrate them into the module. For incorporation into a circuit environment, the module substrate has solderable contacts at an underside, by means of which it can be soldered on a printed circuit board (PCB).

For the solderable contacts of ceramic module substrates, standard silver-containing pastes are printed on and fired into the ceramic. In order to produce a solderable surface, these are usually provided with a metallic coating, a gold layer usually serving as the topmost solderable layer.

Since the solderable contacts constitute the only structures formed on the underside of the module substrate, the fired or sintered pastes are usually provided with the metallic coating directly after firing in electrolytic or electroless methods. In this case, the electrically conductive paste is completely coated by the metallic coating.

In mechanical loading tests it has now emerged that the transition from the metallic coating to the ceramic constitutes a location in the module substrate that is subjected to severe mechanical loading and is, therefore, severely at risk of fracture. This stems from the fact that thermal and mechanical stresses usually occur after the soldering of the module substrate, the stresses preferably acting on the material coating.

SUMMARY

In one aspect, the present invention specifies a module substrate in which the above-mentioned risk of fracture is reduced.

The inventors have found that the forces acting on the solderable contacts after the soldering of the module substrate (e.g., onto a PCB) can be distributed significantly better if the region that can be wetted with solder omits the outer edges of the solderable contact on the module substrate. Therefore, a module substrate is proposed, having a multilayer construction and a ceramic layer at least as a bottommost layer. Solderable contacts are applied on the underside of the ceramic layer, the solderable contacts including the conductive paste fired into the ceramic in the form of a pad. A covering layer is applied in a manner bearing on the bottommost ceramic layer and the pad, in which covering layer a window is cut out over the pad.

In this case, all the outer edges of the pad remain covered by the covering layer. In the window—and only in the window—a metallic coating is applied on the pad, the metallic coating making a solderable surface available for the solderable contact.

With a module substrate embodied in this way, two mutually independent advantages are achieved. The force-locking connection—occurring after the soldering of the module substrate—to the printed circuit by means of the solder is restricted to the region of the window and can, therefore, no longer act directly on the edge of the pad and produce an increased risk of fracture there at the material transition. Since the force-locking connection commences at a distance from the outer edge of the pad, the forces acting on the pad can be better distributed over the pad area.

A further advantage is that the desired size of the solderable contact can be defined by means of the size of the window cut out from the covering. It is thereby possible to embody the pad area independently of the desired size of the solderable contact and, in particular, as significantly larger than is necessary for the solderable contact. In this way, too, the forces that act are distributed better and over a larger base area, with the result that the tensile and shear forces that act per unit area are reduced by comparison with a known solderable contact.

A further advantage consists in the fact that the transition between pad and ceramic is protected against undercutting such as can occur in metallization baths set in an acidic or alkaline fashion.

In one embodiment of the invention, the covering layer is applied over the whole area on the underside of the bottommost ceramic layer and omits only the windows. Such a whole-area covering layer can be applied and patterned in a simple manner in the form of a resist, and in particular in the form of a photoresist. In this embodiment, the windows and thus the contact areas that can be wetted with solder can be patterned in a particularly simple manner by means of optical methods and with virtually any desired geometrical configuration. With a whole-area covering layer, or covering layer that covers the entire ceramic layer on the underside, a sensitive ceramic can also be protected.

In one preferred embodiment, however, the covering layer includes a glass layer. Such a layer can be applied in a simple manner in the form of a printable paste including glass particles and can be fired for solidification. A screen printing method, in particular, is suitable for application purposes. A covering layer composed of glass has the advantage that it is mechanically and thermally stable and, moreover, affords good protection during the application of the metallic coating by means of electrolyte or electroless methods during which the module substrate is exposed to the deposition baths set in an acidic or alkaline fashion. Moreover, glass is thermally well matched to conventional ceramics and ceramic substrates.

In the case of known solderable contacts, after the deposition of the metallic coating on the pad, undercutting is often observed at the outer edges of the pad, the undercutting being brought about by the aggressive or caustic medium of the metallic deposition bath, which can attack both the ceramic and the pad. Undercutting of the pad can be reliably avoided with the covering according to the invention composed of resist or glass. By this means as well, the strength of the solderable contact with respect to forces acting mechanically thereon is increased or not reduced by undercutting.

For a highly integrated module substrate in which a multiplicity of conductor tracks, plated-through holes and also, if appropriate, passive components are integrated, an LTCC ceramic, in particular, is suitable on account of its strength to withstand warpage during sintering. This technology makes it possible, in particular, to produce miniaturized structures with low tolerance and high method reliability on and in the multilayer construction.

A module substrate requires an integrated electrical wiring if there are mounted on the topside one or a plurality of discrete chip components or further integrated multilayer components which are interconnected by means of the module substrate and are electrically conductively connected to the solderable contacts on the underside. An LTCC ceramic, by way of its usually internally strained multilayer construction, intrinsically has a high risk of fracture of individual layers. Therefore, the module substrate according to the invention proves to be particularly advantageous as an LTCC multilayer construction.

The metallic coating on the silver-containing pad can have a composition known per se. It is customary to apply a base metallization having a sufficient current-loading capacity and over that a thin gold layer, by means of which the solderability and, in particular, the wettability of the solderable contact with solder are produced. In a known embodiment that can be employed in the case of the invention, too, the metallic coating includes a nickel layer, which can also serve as a diffusion barrier and prevents Pd or Au from alloying into the metallic support. A palladium layer can be arranged over that, the palladium producing a bondable surface. A gold layer can be provided over that as the topmost layer, the gold layer also providing protection against oxidation for the palladium. All three layers can be deposited electroless and in deposition baths known per se and also, if appropriate, galvanically. Gold and aluminium wires can be bonded on such a metallic coating. Silver-containing conductive adhesives adhere thereon just as well as epoxide-containing adhesives. It can be wetted with lead-containing and lead-free solders; the solder locations adhere well on the metallic coating.

A method for producing the solderable contacts having, as stated, an increased mechanical strength is described below. The contacts are applied on a multilayer construction serving as a module substrate, in which multilayer construction at least the bottommost layer is a ceramic layer. An electrically conductive paste is applied on the underside of the multilayer construction, that is to say on the underside of the bottom ceramic layer, and, if appropriate, is patterned to form the pad. Afterwards, a covering layer is applied over the underside of the bottom ceramic layer and over the pads, which covering layer completely covers the edges of the pads, but a respective window is cut out for the subsequent application of solder for the solderable contact. Afterwards, in the windows, a metallic coating is deposited from the solution electrolytically or in electroless fashion on the pads, which metallic coating provides the solderable metallization for the solderable contact. The covering layer guarantees that the metallic coating is deposited only within the window and only there and on the pad.

For the pad, preferably an electrically conductive paste containing silver particles is printed on, in particular by means of screen printing. For better adhesion and for removing the binder required for the printing-on process, the pad is fired. The good adhesion is obtained in particular by means of glass or ceramic particles, which are concomitantly contained in the paste.

As the covering layer, preferably a paste comprising glass particles is printed on and likewise fired. The paste additionally includes a binder alongside the glass particles and can contain a solvent for setting a suitable viscosity that makes the paste printable.

If both the pad and the covering layer are printed on, then the firing can be effected in a common firing step. However, it is also possible firstly to introduce the pad then to apply the covering layer and again fire it.

The module substrate according to the invention and the method for producing the solderable contacts thereon afford a novel possibility for the geometrical patterning of the pads. In the case of a module substrate, the arrangement and size of the solderable contacts is usually predefined by a desired or required footprint. Since the surface that can be wetted with solder and is therefore solderable is determined, according to the invention, by the windows, but the remaining regions of the surface are covered by the covering layer, the restrictions as a result of the predefined footprint are not applicable to the patterning of the pads. The pads can now be produced with a maximum size, which is limited, however, by the geometrical preconditions on the underside of the module substrate, the available space, the compliance with sufficient electrical insulation of adjacent contacts, a method tolerance, and as a result of maximum permissible parasitic electromagnetic interactions with respect to adjacent metallic structures. In general, however, the pad base area can be significantly increased in this way relative to the contact diameter predefined by the footprint. Preferably, each window is then arranged centrally over the pad, or the pad is arranged under the window in such a way that the window is centered over the pad. The covering then covers all the outer edges of the pad and also a marginal strip of the pad, the marginal strip following the outer edges.

In one preferred embodiment of the method according to the invention, the covering layer or the material of the covering layer is chosen such that it is inert with respect to the conditions that take effect during deposition of the metallic coating in the form of metal-containing deposition baths set in an acidic or alkaline fashion onto the module substrate. This prevents firstly the covering layer from being attacked or undercut by the deposition bath. This guarantees that the mechanical strength of the entire construction is also maintained after the soldering of the module substrate to a printed circuit board.

The method can be used not only for the production of solderable contacts on module substrates, but also for producing contacts on ICs. In that case, the layer to which the pad is applied is then a semiconductor layer or an insulating layer such as silicon oxide, silicon nitride, silicon carbide or some other material used in semiconductor technology. The method steps for producing the metallic coating with the aid of a covering layer and the window provided therein over the pad can otherwise be used in an equivalent manner and here as well manifest their advantages with regard to reduced undercutting and generally better durability of the pads on the respective support.

BRIEF DESCRIPTION OF THE DRAWINGS

The invention is explained in greater detail below on the basis of exemplary embodiments and the associated figures. The figures serve solely for elucidating the invention and have, therefore, been made only schematic and not true to scale. Individual parts may be illustrated with a distorted size, and so relative dimensional indications cannot be gathered from the figures either.

The following list of reference symbols can be used in conjunction with the drawings:

P Pad
KS Ceramic layer
VL Connecting conductor
DK Plated-through hole
MC Metallic coating
RS Marginal strip
F Window
$D_F$ Diameter of F
$D_P$ Diameter of P
CB Chip component
$A_{FF}$ Distance between two adjacent windows
$A_{PP}$ Distance between two adjacent pads
PK Outer edge of pad
AS Covering layer
MS Multilayer construction
CB Chip component
BL Fracture line
PCB Printed circuit board or printed circuit
L Solder
LK Solderable contact

DETAILED DESCRIPTION OF ILLUSTRATIVE EMBODIMENTS

Figure 1A:
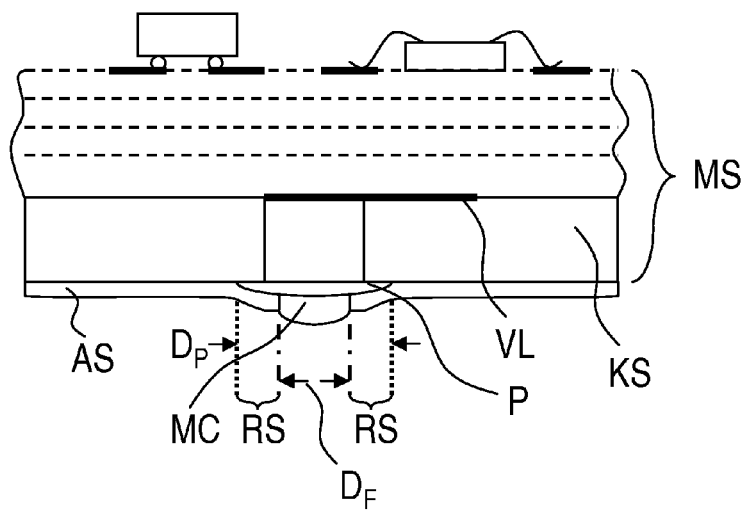
FIG. 1A shows a module substrate according to the invention in schematic cross section.

FIG. 1A shows the construction of a solderable contact according to the invention on the basis of a schematic cross section through a module substrate. The module substrate has a multilayer construction, the bottommost layer of which is a ceramic layer KS. The remaining layers of the multilayer construction are merely indicated by dashed lines in the figure.

A plated-through hole DK is led through the bottommost ceramic layer KS, the plated-through hole here connecting a connecting conductor VL arranged within the multilayer construction to the underside of the bottom ceramic layer KS. However, a plated-through hole can also connect the underside directly to the top side of the module substrate.

Alongside pads with which electrical contact is to be made, it is also possible, according to the invention, to produce dummy pads. The latter therefore do not have to be arranged over a plated-through hole or a via. However, they can be connected to a via.

On the underside of the ceramic layer KS, a pad P is arranged directly over the plated-through hole DK, the pad constituting a fired contact. The pad P is preferably printed on from a composition containing silver particles and glass particles in particular by means of a screen printing method and is fired. A covering layer AS is applied on the underside of the bottom ceramic layer KS and the pad P and patterned in such a way that it covers the edges of the pad P and a marginal strip RS following the edges over the entire periphery of the pad P and additionally seals to the ceramic layer KS. A window F is cut out centrally over the pad P (FIG. 1B), in which window a metallic coating MC is applied over the pad P. The coating MC preferably terminates flush with the covering layer AS and, with regard to the layer thickness, is thinner than the silver-containing pad P.

Furthermore, components and in particular chip components CB are mounted on the top side of the module substrate, lying opposite the underside, and are connected and electrically contact-connected to the module substrate by means of suitable connection techniques. These chip components CB can be mounted and electrically contact-connected, for example, using flip-chip technology (see chip component CB1) or, like the chip component CB2, for example, can be attached by adhesive bonding and be connected, by means of wire bonding technology, to corresponding contacts arranged on the top side of the module substrate. It is also possible for the chip components or else individual components to be soldered on and electrically contact-connected in one step by means of SMD technology.

That region of the solderable contact that is available for the electrical contact-connection is defined by the window F cut out in the covering layer AS. The dimensions of the window such as, for example, the diameter $D_F$ thereof correspond to the dimensions of the metallic coating MEMS chip or define them. The pad P, by contrast, has a larger base area, characterized for example by the diameter $D_P$, where $D_P > D_F$. Consequently, the window area corresponds to the pad area reduced by the area of the marginal strip RS.

Figure 1B:
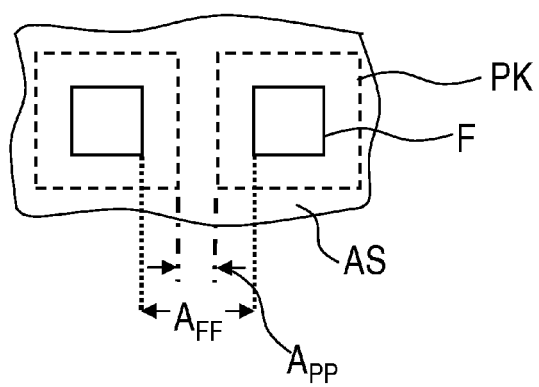
FIG. 1B shows the module substrate with the solderable contacts from the underside.

FIG. 1B shows an excerpt from a module substrate in the plan view of the underside, which reveals the arrangement of the marginal strip RS. The windows F are shown with a solid line, while the pad dimensions in the form of the pad edge PK are illustrated with a dashed line. The marginal strip RS overlapped by the covering layer AS makes it clear that, in this way, the distance $A_{FF}$ between two adjacent windows is greater than the distance $A_{PP}$ between the associated pads P by two marginal strip widths. Overall, the dimensions are chosen such that, firstly, the pad area is maximal without formation of unallowed parasitic effects, such as, in particular parasitic capacitances with respect to adjacent metallizations, which can lead to crosstalk. Moreover, migration of silver is reliably prevented by a sufficient distance. Consequently, the pad area and pad arrangement correspond to a weighing-up of different optimization aims. By contrast, the arrangement and size of the windows F are predefined by the module substrate footprint that is desired or required by the customer. In general, the window, and thus the surface of the solderable contact, has a diameter $D_F$ of 200 to 300 μm. It can also be embodied in square or rectangular fashion. This takes account firstly of reliable soldering of the module substrate onto a printed circuit board, and secondly of reliable patterning of the covering layer AS. Particularly if the covering layer AS is applied in the form of a glass-containing paste by means of a printing method, such a diameter ensures that the window opening does not flow in during the firing of the covering layer. Such flowing-in can otherwise be the consequence upon softening of the glass-containing paste of the covering layer AS during the firing on account of adhesion forces and surface tensions.

Figure 1C:
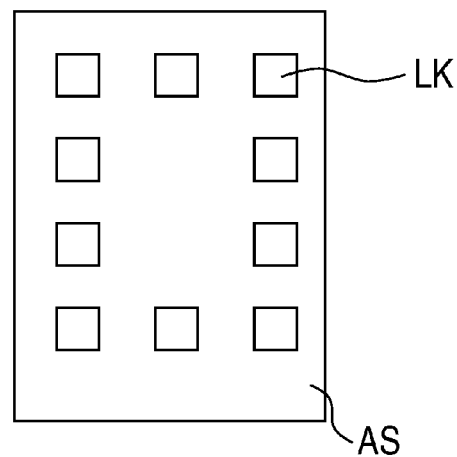
FIG. 1C shows a complete module substrate from the underside.

FIG. 1C shows the underside of the entire module substrate and thus the entire footprint in the form of the metallic coatings that are uncovered in the windows and that constitute the surface of the solderable contacts LK. The solderable contacts LK are preferably arranged along and in the vicinity of the outer edges of the module substrate. However, it is also possible to arrange some or additional contacts centrally along main axes.

As a result of the relatively large base area of the module substrate in comparison with the chip components, after the module substrate has been soldered into a circuit environment, the thermal and mechanical strains that occur can also be significantly larger than in the case of the component itself. The solderable contacts according to the invention firstly increase the strength of the solderable contacts on the module substrate and secondly greatly reduce the probability of the occurrence of fractures or cracks in the bottom ceramic layer and, if appropriate, in another ceramic layer.

FIG. 2 shows different method stages during the production of the solderable contacts on the basis of schematic cross sections through a module substrate.

Figure 2A:
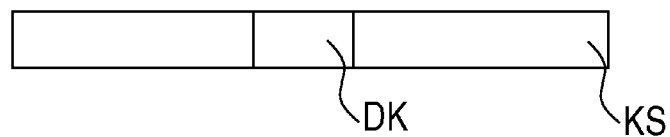
FIGS. 2A to 2D show different method stages during production on the basis of schematic cross sections.

FIG. 2A shows a multilayer construction MS having a ceramic layer KS at least as bottommost layer. The multilayer construction MS usually consists of a multiplicity of ceramic layers that are stacked one above another as green sheets and are sintered together. Plated-through holes DK are preformed in the form of holes that are stamped in the green sheets and filled with conductive particles. Conductor tracks to be integrated into the multilayer construction MS or passive components formed from conductor pieces and metallization areas are printed in the form of conductive compositions onto the green sheets and sintered together with the latter.

Figure 2B:
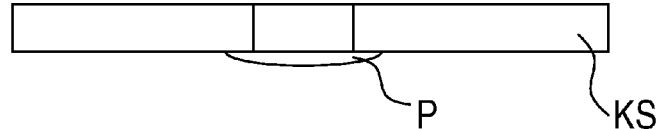

Onto the module substrate that has preferably already been sintered and is illustrated in FIG. 2B, by means of a screen printing method, a conductive paste is then printed centrally over the plated-through holes DK onto the bottommost ceramic layer KS. Directly after printing-on or, if appropriate, after drying, the printed-on contact can be fired, the pad P being obtained. It is also possible to apply the pads before the sintering of the module substrate and to subject them to a co-sintering process together with the module substrate.

Figure 2C:
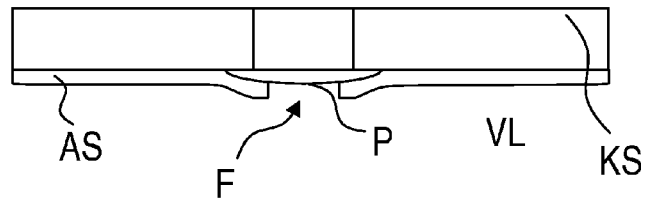
Figure 2D:
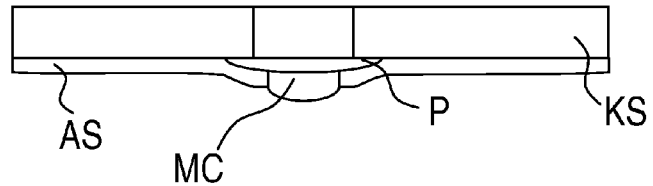

FIG. 2C shows the arrangement after the application of the covering layer AS. The latter is, for example, likewise printed on in the form of a printable paste containing glass particles, in particular by means of screen printing. In this case, the screen printing composition is chosen such that, after firing, it has a sufficient resistance towards the subsequently employed metallization baths for producing the metallic coating. A further optimization aim in the choice of a suitable covering layer is a matched thermal behavior. This means that the fired covering layer has a coefficient of thermal expansion similar to that of the module substrate and in particular to that of the bottom ceramic layer KS.

After being printed on, the covering layer AS is fired. However, it is also possible merely to dry the printed-on pad, then to apply the covering layer and jointly fire covering layer and pad.

In the next step, the metallic coating is produced by means of a series of metal deposition steps. Nickel layers, for example, have proved to be worthwhile for an electrically loadable base metallization, which nickel layers can be deposited in electroless fashion. A palladium layer, for example, can be deposited over those likewise in electroless fashion, which palladium layer facilitates the deposition of the gold layer then applied as a final layer. The gold layer can be applied, for example, as so-called flash gold by means of an immersion method such as ENEPIG or ENIG.

In parallel with the production of the solderable contacts on the underside or else separately therefrom, solderable contacts can be produced on the topside (not illustrated in the figure). Afterwards it is possible to carry out a placement process on the surface, wherein chip components and other discrete components are mounted on the surface and electrically conductively connected to the module substrate by means of the solderable contacts. This can be done in one step in the case of flip-chip and SMD processes.

Prior to placement, solder can be applied to the solderable contacts. In order to produce a land grid array (LGA), a solder layer is applied to the solderable contacts for this purpose. In order to produce a ball grid array, solder balls are applied to the surface of the metallic coating MC. For both variants, the solderable contacts according to the invention are particularly well suited since the covering layer AS can additionally function as a soldering resist in this case. The dimensions of the applied solder can thereby be controlled particularly reliably and precisely.

Figure 3A:
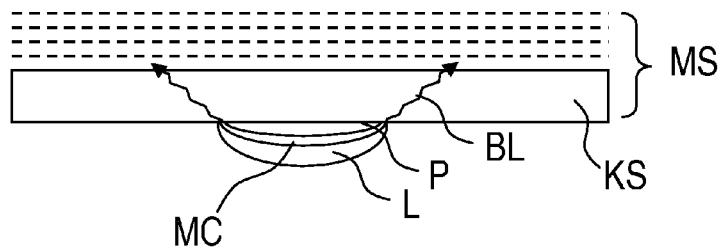
FIG. 3A shows a known module substrate in schematic cross section with forces that act.
Figure 3B:
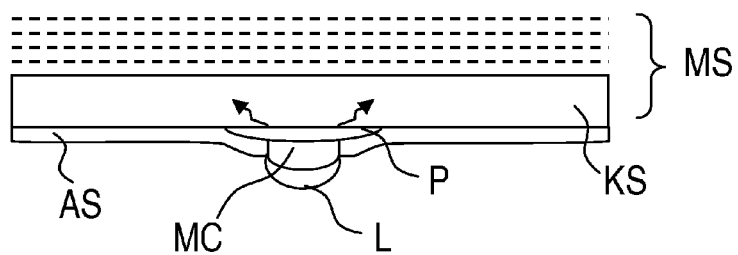
FIG. 3B shows a module according to the invention in cross section with forces that act.

FIG. 3A illustrates the fracture susceptibility of a module substrate with a conventional solderable contact, while FIG. 3B shows the fracture susceptibility of a module substrate provided with solderable contacts according to the invention. The known solderable contact likewise has a printed-on and fired pad P, which, however, is covered over the whole area by a metallic coating MC. In this case, the metallic coating MC comes into contact with the underside of the ceramic layer KS and tapers off there with a small layer thickness. It is precisely at these margins where the edges of the metallic coating abut the ceramic layer that the ceramic and/or the fired pad can be attacked during the electrolytic or electroless process in the metal deposition bath. Undercutting can occur at this edge in this case.

As illustrated in FIG. 3, a solder layer L has already been applied over the metallic coating, the solder layer following the base area of the metallic coating. At the abutting edges with respect to the underside of the ceramic layer KS, the solder layer also tapers off thinly. If the solderable contact is then soldered to a PCB by means of this solder layer L, mechanical forces can act directly on all interfaces on account of thermal stresses or mechanical stresses by way of the solder L and the metallic coating.

The jagged lines BL within the module substrate illustrate (potential) fracture lines BL and indicate that tensile, shear and other forces preferably act on the module substrate at the edges and, in particular, at the transition of metallic coating MC/pad P/ceramic layer KS. The starting point of possible fractures is also usually observed there, the fractures preferably continuing along the fracture lines shown or others imagined. This effect is intensified by the fact that the outer edge of the metallization can already be readily detached from the ceramic layer on account of the undercutting.

A further fault possibility and hence a failure possibility for the entire module is, therefore, the tearing-away of the solderable contact from the ceramic layer.

In contrast to this, a contact according to the invention is illustrated in schematic cross section in FIG. 3B. Here, too, possible fracture lines BL are depicted, but they do not begin at the edges of the pad and they occur with a significantly reduced fracture probability. In this case, the length of the fracture lines BL represents a measure of the fracture probability. The higher fracture strength stems from the fact that, firstly, the forces are distributed better over the larger pad area and, secondly, the points of action of the forces are offset laterally relative to the margin of the pad. Moreover, no undercutting whatsoever can occur here, such that, consequently, no instances of prior damage or partial detachments at one of the partial layers of the solderable contact are present either.

Figure 4:
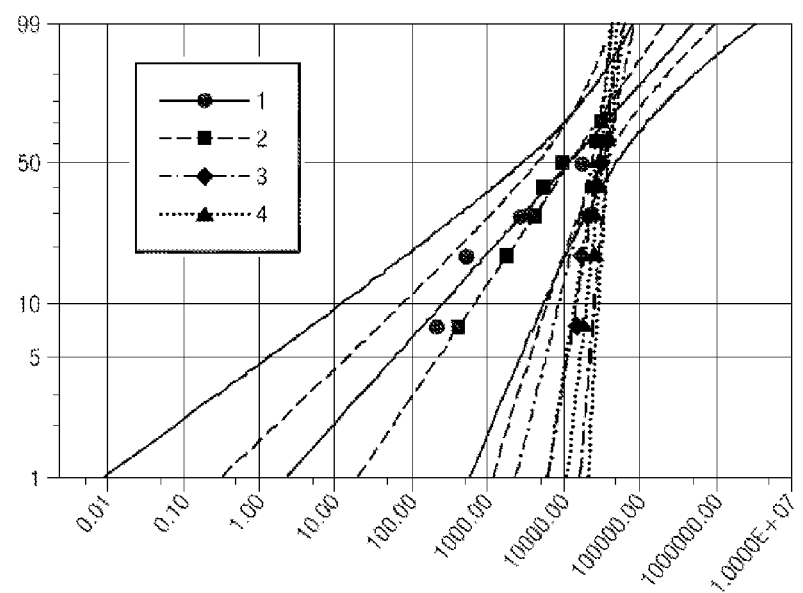
FIG. 4 shows the failure rates of known module substrates and module substrates according to the invention after bending cycles.

FIG. 4 illustrates the failure rates of two module substrates after a series of bending cycles in the soldered state as a function of the number of bending cycles. A first curve 1 shows a module substrate that has solderable contacts embodied in accordance with FIG. 3A, for example. It is evident that after just a small number of cycles, first failures occur, which increase exponentially as the number of cycles increases. The situation is very different, by contrast, for the failures of module substrates according to the invention as illustrated on the basis of curve 2. It becomes clear from the curve profile that first failures actually first occur after a high number of, here, approximately ten thousand cycles. This means that solderable contacts according to the invention are resistant over a high number of mechanically loading cycles (here bending cycles) and until then have no failures. The superiority of soldering contacts according to the invention relative to known solderable contacts clearly emerges from these mechanical tests and, in particular, the resultant curves illustrated in FIG. 4. The improved mechanical stability makes the module substrate reliable, increases the life time thereof and reduces costs.

Figure 5:
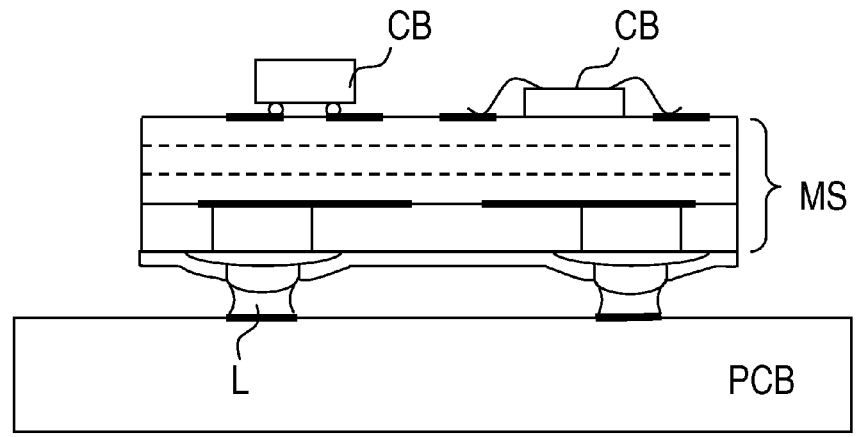
FIG. 5 shows a module substrate mounted on a printed circuit board, in cross section.

FIG. 5 shows, finally, how a module substrate MS equipped with chip components CB can be soldered to a printed circuit board PCB.

The invention is not restricted to the exemplary embodiments illustrated in the figures or to other specific embodiments. Rather, the invention permits a multiplicity of variations with regard to geometrical configuration and choice of the materials used for the contacts and the covering layer. The module substrate is also not restricted by the type and construction of the multilayer construction, nor by the type and interconnection of the chip components combined on the module or of the passive components integrated into the module substrate and their interconnections.

What is claimed is:

1. A method for producing solderable contacts, the method comprising:
    applying pads composed of an electrically conductive paste to a multilayer substrate that comprises a bottommost ceramic layer;
    after applying the pads, applying a covering layer over the pads, wherein the covering includes a plurality of windows, each window overlying one of the pads such that the covering layer completely covers all edges of the pads; and
    depositing a solderable metallization as a metallic coating in the windows and electrically connected to the pads;
    wherein an electrically conductive paste containing silver particles is printed on and fired for the pad; and
    wherein a second paste comprising glass particles is printed on and fired as the covering layer such that the pad and the covering layer are fired in a common step.

2. The method according to claim 1, wherein depositing the solderable metallization comprises electrolytically depositing from a solution.

3. The method according to claim 1, wherein depositing the solderable metallization comprises depositing in an electroless fashion.

4. The method according to claim 1, wherein applying the covering layer comprises applying and patterning a photopatternable resist.

5. The method according to claim 1, wherein a footprint that predefines the size and position of the solderable contacts is predefined for the substrate,
    wherein the pads are produced with a maximum geometrically and electrically permissible size,
    wherein the windows are provided in the covering layer with an arrangement and size corresponding to the footprint in such a way that each window is arranged over the pad and the covering layer covers all outer edges of the pad and also a marginal strip of the pad, the marginal strip following the outer edges.

6. The method according to claim 1, wherein depositing the solderable metallization comprises using metal-containing deposition baths set in an acidic or alkaline fashion and wherein the covering layer is resistant to the deposition baths.

7. The method according to claim 6, wherein the covering layer covers all outer edges of the pads such that a transition between the pad and ceramic layer is protected against undercutting when depositing the solderable metallization comprises using the metal-containing deposition baths.

8. The method according to claim 1, depositing a solderable metallization comprises first depositing at least one electrically loadable metal layer and then applying a gold layer.

9. The method according to claim 1, wherein the covering layer comprises a glass.

10. A method for producing solderable contacts, the method comprising:
    applying pads composed of an electrically conductive paste to a multilayer substrate that comprises a bottommost ceramic layer;
    after applying the pads, applying a covering layer over the pads, wherein the covering includes a plurality of windows, each window overlying one of the pads such that the covering layer completely covers all edges of the pads, wherein an electrically conductive paste containing silver particles is printed on and fired as the covering layer; and
    depositing a solderable metallization as a metallic coating in the windows and electrically connected to the pads.

11. A method for producing solderable contacts, the method comprising:
    applying pads composed of an electrically conductive paste to a multilayer substrate that comprises a bottommost ceramic layer;
    after applying the pads, applying a covering layer over the pads, wherein the covering includes a plurality of windows, each window overlying one of the pads such that the covering layer completely covers all edges of the pads; and
    depositing a solderable metallization as a metallic coating in the windows and electrically connected to the pads, wherein depositing a solderable metallization comprises first depositing at least one electrically loadable metal layer and then applying a gold layer and wherein depositing the at least one electrically loadable metal layer comprises depositing an Ni layer and then a Pd layer.

12. The method according to claim 11, wherein depositing the solderable metallization comprises electrolytically depositing from a solution.

13. The method according to claim 11, wherein depositing the solderable metallization comprises depositing in an electroless fashion.

14. The method according to claim 11, wherein an electrically conductive paste containing silver particles is printed on and fired for the pad.

15. The method according to claim 14, wherein a second paste comprising glass particles is printed on and fired as the covering layer such that the pad and the covering layer are fired in a common step.

16. The method according to claim 11, wherein an electrically conductive paste containing silver particles is printed on and fired as the covering layer.

17. The method according to claim 11, wherein applying the covering layer comprises applying and patterning a photopatternable resist.

18. The method according to claim 11, wherein a footprint that predefines the size and position of the solderable contacts is predefined for the substrate,
    wherein the pads are produced with a maximum geometrically and electrically permissible size, wherein the windows are provided in the covering layer with an arrangement and size corresponding to the footprint in such a way that each window is arranged over the pad and the covering layer covers all outer edges of the pad and also a marginal strip of the pad, the marginal strip following the outer edges.

19. The method according to claim 11, wherein depositing the solderable metallization comprises using metal-containing deposition baths set in an acidic or alkaline fashion and wherein the covering layer is resistant to the deposition baths.

20. The method according to claim 11, depositing a solderable metallization comprises first depositing at least one electrically loadable metal layer and then applying a gold layer.

\* \* \* \* \*